(12) United States Patent
Hoshino et al.

(10) Patent No.: US 9,213,070 B2
(45) Date of Patent: Dec. 15, 2015

(54) CALCULATION METHOD, CALCULATION SYSTEM, AND CALCULATION APPARATUS

(75) Inventors: Masayuki Hoshino, Kanagawa-ken (JP); Tomokazu Morita, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 542 days.

(21) Appl. No.: 13/482,256

(22) Filed: May 29, 2012

(65) Prior Publication Data
US 2012/0310566 A1    Dec. 6, 2012

(30) Foreign Application Priority Data

May 31, 2011   (JP) ................. P2011-122965

(51) Int. Cl.
G01R 31/36   (2006.01)
G01R 31/00   (2006.01)

(52) U.S. Cl.
CPC .......... G01R 31/3651 (2013.01); G01R 31/007 (2013.01); G01R 31/3658 (2013.01)

(58) Field of Classification Search
CPC .............. G01R 31/36; G01R 31/3651; G01R 31/3679; G01R 31/3606; G01R 31/3624; G01R 31/3648; G01R 31/3658; G01R 31/3662
See application file for complete search history.

(56) References Cited

U.S. PATENT DOCUMENTS

| | | | |
|---|---|---|---|
| 2004/0023117 A1* | 2/2004 | Imachi et al. | 429/231.95 |
| 2007/0096743 A1* | 5/2007 | Arai et al. | 324/426 |
| 2011/0301891 A1* | 12/2011 | Kim | 702/63 |
| 2012/0109443 A1* | 5/2012 | Takahashi et al. | 701/22 |
| 2012/0133331 A1* | 5/2012 | Ling et al. | 320/132 |
| 2013/0027047 A1* | 1/2013 | Yoshioka et al. | 324/426 |

FOREIGN PATENT DOCUMENTS

| | | |
|---|---|---|
| JP | 2004063394 A | 2/2004 |
| JP | 2007139536 A | 6/2007 |
| JP | 2009080093 A | 4/2009 |
| JP | 2011-75461 | 4/2011 |

OTHER PUBLICATIONS

Office Action issued in related Japanese Patent Application No. 2011-122965 mailed Feb. 13, 2015, 7 pages.

* cited by examiner

*Primary Examiner* — Toan Le
(74) *Attorney, Agent, or Firm* — Baker Botts L.L.P.

(57) ABSTRACT

A calculation method causing a calculation apparatus configured to calculate a voltage of a battery to implement a computation capability includes: referring to a detection value database configured to store a charge amount of a battery and a voltage of the battery, the voltage being generated when the battery is charged, while associating the charge amount of the battery with the voltage of the battery, and a function information database configured to store a function representing a relationship between the voltage and a charge amount of each of a plurality of active materials included in the battery; and performing a regression calculation on the voltage of the battery that is stored in the detection value database, with an amount of the active materials of the function stored in the function information database being set as a variable.

8 Claims, 7 Drawing Sheets

US 9,213,070 B2

CALCULATION METHOD, CALCULATION SYSTEM, AND CALCULATION APPARATUS

CROSS-REFERENCE TO RELATED APPLICATIONS

This application is based upon and claims the benefit of priority from the prior Japanese Patent Application Nos. 2011-122965, filed on May 31, 2011, 2011-124417 filed on Jun. 2, 2011, 2011-124418 filed on Jun. 2, 2011, 2011-124419 filed on Jun. 2, 2011, and 2012-092753 filed on Apr. 16, 2012, the entire contents of which are incorporated herein by reference.

FIELD

Embodiments described herein generally relate to a calculation method, a calculation system, and a calculation apparatus that calculate a deterioration state of a battery.

BACKGROUND

Studies of a calculation method, a calculation system, and a calculation apparatus that calculate a deterioration state of a battery are progressing. For example, as disclosed in Japanese Patent Application Laid-open No. 2011-75461, an evaluation of a battery cell with use of a value of a capacity of the battery cell is performed.

However, the evaluation based only on the capacity fails to grasp a more precise status, for example, because which one of a cathode and an anode is deteriorated.

DETAILED DESCRIPTION

In view of the above circumstances, an aspect of embodiments provides a calculation method of implementing a computation capability of: referring to a detection value database configured to store a charge amount of a battery and a voltage of the battery, the voltage being generated when the battery is charged, while associating the charge amount of the battery with the voltage of the battery, and a function information database configured to store a function representing a relationship between the voltage and a charge amount of each of a plurality of active materials included in the battery; and performing a regression calculation on the voltage of the battery that is stored in the detection value database, with an amount of the active materials of the function stored in the function information database being set as a variable.

According to the aspect of embodiments, a deterioration state of a battery is calculated more precisely.

Hereinafter, the embodiment will be described with reference to the drawings.

First Embodiment

Figure 1:
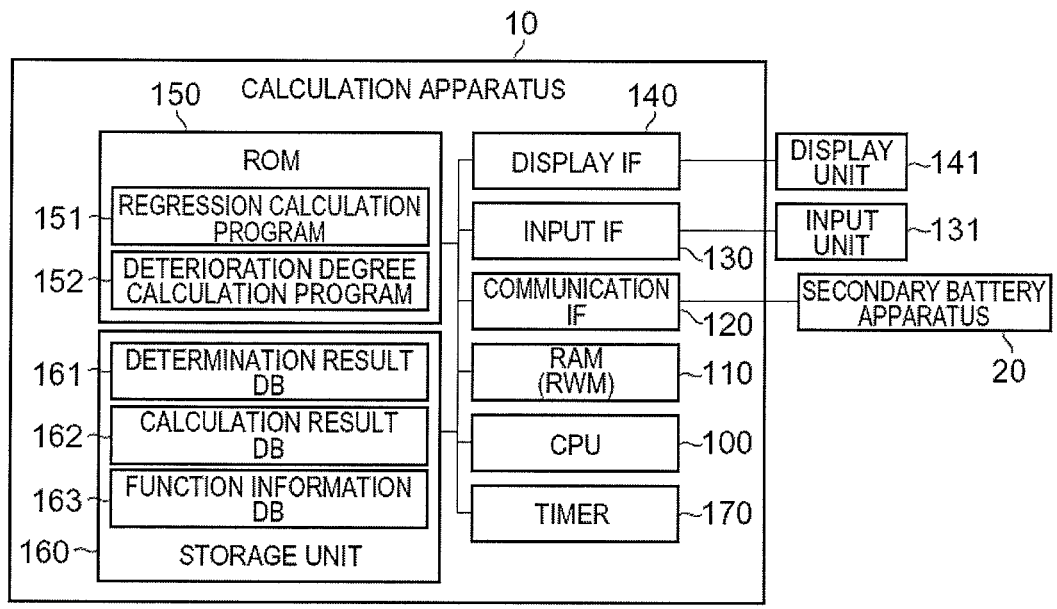
FIG. 1 is a block diagram of a calculation system according to a first embodiment.
Figure 2:
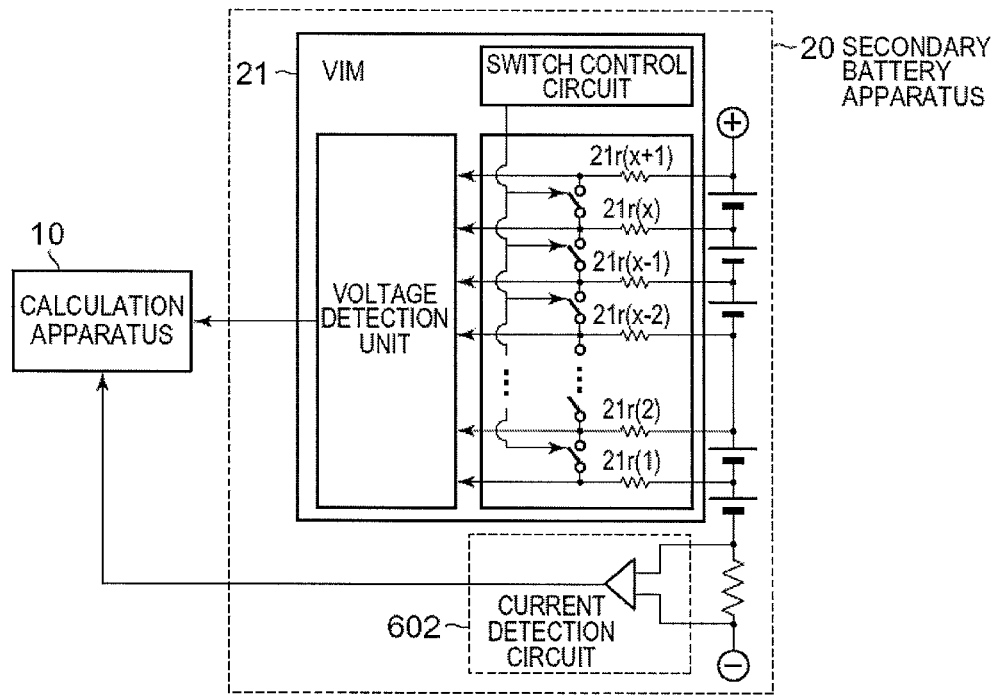
FIG. 2 is a block diagram of a battery apparatus according to the first embodiment.

FIG. 1 is a configuration diagram of a calculation system according to this embodiment.

The calculation system shown in FIG. 1 is a computer system that calculates a remaining capacity of a secondary battery apparatus 20. In this embodiment, a calculation apparatus 10 as one of constituent elements of the calculation system is constituted of a calculation apparatus group in which apparatuses are used in combination via communication networks such as a LAN (local area network) and an intranet in accordance with processing performance of the apparatuses.

The calculation apparatus 10 includes a CPU (central processing unit) 100, a RAM (random access memory) or a RWM (read-write memory) 110, a communication IF (interface) 120, an input IF 130, a display IF 140, a ROM (read-only memory) 150, a storage unit 160, and a timer 170. In addition, the calculation apparatus 10 may include an interface for mounting thereto an external storage device such as a USB (universal serial bus) memory. The calculation apparatus 10 is a computer that executes programs and performs a computation.

The calculation apparatus 10 collects data including a current value, a voltage value, and the like from the secondary battery apparatus 20 via the communication IF 120 and uses the collected data to perform various types of computation processing.

The CPU 100 is a computation processing unit (microprocessor) that reads out, to the RAM 110, programs written in advance into the ROM 150 and performs calculation processing. The CPU 100 is constituted of a plurality of CPU groups (microcomputers and microcontrollers) in accordance with capabilities. Further, the CPU may include a built-in memory having a RAM capability.

The RAM (RWM) 110 is a memory that serves as a storage area used by the CPU 100 when executing programs and is used as a working area. The RAM (RWM) 110 is suitably used for primary storage of data necessary for processing.

The communication IF 120 is a communication apparatus or a communication unit that exchanges data with the second battery apparatus 20. Examples of the communication IF 120 include a router. In this embodiment, the connection between the communication IF 120 and the secondary battery apparatus 20 is described as being established by wired communication, but the connection may be established by various wireless communication networks, instead of the wired communication. Further, the connection between the communication IF 120 and the secondary battery apparatus 20 may have a form to be established via a network that allows one-way or two-way communication.

The input IF 130 is an interface that connects an input unit 131 and the calculation apparatus 10 to each other. The input IF 130 may have an input control capability of converting an input signal transmitted from the input unit 131 into a signal that is recognizable by the CPU 100. This interface is not an indispensable constituent element as a terminal or the like and may be directly connected to wiring within the calculation apparatus 10.

The input unit 131 is an input apparatus or an input unit that controls inputs received from various types of keyboards, buttons, and the like that are generally provided to a computer apparatus. In addition, the input unit 131 may have a capability of recognizing a human voice to thereby recognize or detect the voice as an input signal. In this embodiment, the input unit 131 is externally provided to the calculation apparatus 10, but the input unit 131 may have a form to be incorporated into the calculation apparatus 10.

The display IF 140 is an interface that connects a display unit 141 and the calculation apparatus 10 to each other. Display control on the display unit 141 may be performed by the CPU 100 via the display IF 140 or may be performed by an LSI (large-scale integration) or a GPU (graphics processing unit) for performing drawing processing, such as a graphics board. The display control capability includes, for example, a decoding capability of decoding image data. The display IF 140 may have a form to be directly connected to the inside of the calculation apparatus 10 without using interfaces.

The display unit 141 is an output apparatus or an output unit such as a liquid crystal display, an organic EL (electroluminescence) display, or a plasma display. Additionally, the display unit 141 may have a capability of emitting a sound. In this embodiment, the display unit 141 is externally provided to the calculation apparatus 10, but the display unit 141 may be incorporated into the calculation apparatus 10.

The ROM 150 is a program memory that stores a regression calculation program 151 and a deterioration degree calculation program 152. Here, a non-primary storage medium into which data is not written is suitably used therefor, but the ROM 150 may be a storage medium such as a semiconductor memory capable of reading and writing data as needed. In addition, the ROM 150 may store a display program causing image data to be displayed, as a letter or a pattern that is recognizable by a human, on the display unit 141, a program causing content such as battery deterioration information to be distributed to a terminal 30 via the communication IF 120, an information register program causing acquired data to be stored in the storage unit 160 at predetermined time intervals, and other programs.

The regression calculation program 151 is a unit that causes the CPU 100 to implement a capability of calculating an internal resistance value and capacity values of a cathode and an anode for each of battery cells or assembled batteries that constitute the secondary battery apparatus 20. For example, the following seven values are calculated (analyzed): (1) a capacity of an active material A constituting a cathode; (2) a capacity of an active material B constituting the cathode; (3) a capacity of an anode; (4) a charge amount of the active material A constituting the cathode; (5) a charge amount of the active material B constituting the cathode; (6) a charge amount of the anode; and (7) an internal resistance value.

$$Q_{cA}, Q_{cB}, Q_a, q_0^{cA}, q_0^{cB}, q_0^{a}, R \quad \text{(Numerical Value 1)}$$

Using those values, a change characteristic of a charging voltage to a time, and a characteristic of a cathode potential to the charge amount and/or that of an anode potential to the charge amount are calculated. A specific operation will be described later.

The regression calculation program 151 is constituted of program groups corresponding to respective expressions below. Note that the order of programs is variously changed.

A charging voltage $V_c$ is obtained from Expression 2 below, using an electromotive voltage $V_e$ of the battery and a voltage $V_R$ based on the internal resistance of the battery.

$$V_c = V_e + V_R \quad \text{(Expression 2)}$$

The electromotive voltage $V_e$ of the battery is obtained from Expression 3 below, using a potential $E_c$ of the cathode and a potential $E_a$ of the anode.

$$V_e = E_c - E_a \quad \text{(Expression 3)}$$

The potential of the cathode and that of the anode are obtained from Expression 4 and Expression 5 below, using a charge amount (q), a capacity $Q_{ic}$ of the cathode in an initial state, and a capacity $Q_{ia}$ of the anode in the initial state.

$$E_c = f_c(q/Q_{ic}) \quad \text{(Expression 4)}$$

$$E_a = f_a(q/Q_{ia}) \quad \text{(Expression 5)}$$

Figure 3:
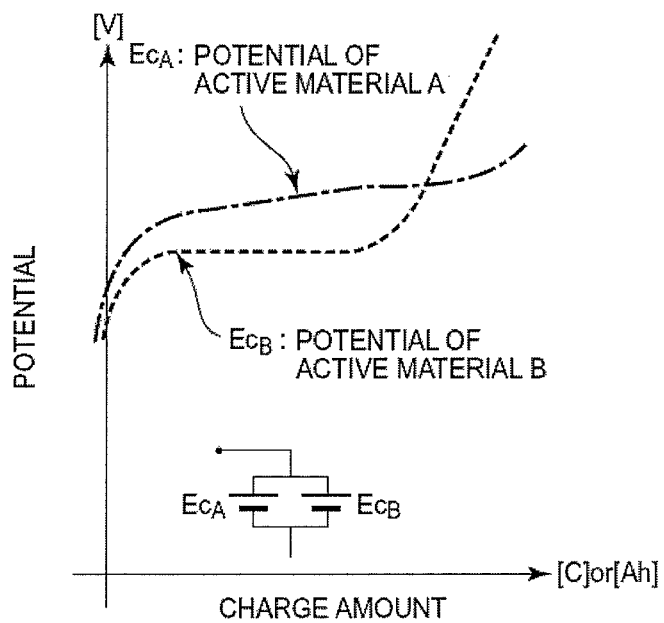
FIG. 3 is a graph showing an example of an electromotive force with respect to a charge amount of a cathode using an active material A and an active material B.
Figure 4:
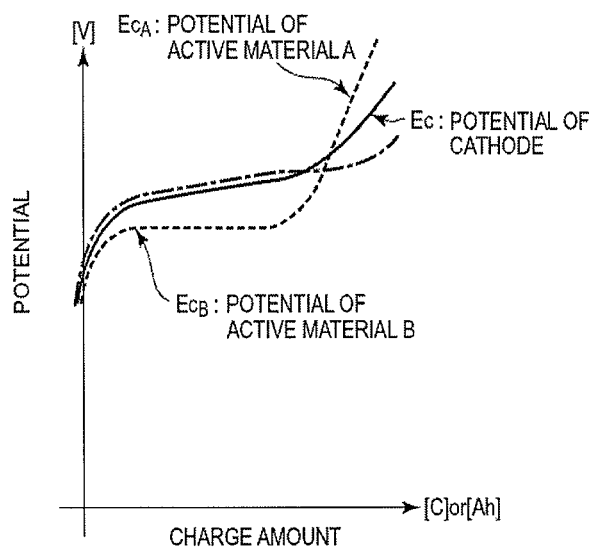
FIG. 4 is a graph showing an example of a potential with respect to the charge amount of the cathode.

Here, a description will be given of a case where the cathode or the anode is formed of a plurality of active materials. In this case, as shown in FIG. 3, the electromotive forces of the respective active materials show different characteristics. The active material A (for example, lithium manganate) and the active material B (for example, cobalt manganate) are mixed to obtain a complex cathode, and characteristics of an electromotive voltage of the complex cathode with respect to the charge amount are calculated. The calculated characteristics are as shown in FIG. 4.

A potential $E_{cA}$ of the cathode of the active material A and a potential $E_{cB}$ of the cathode of the active material B have relationships shown in Expressions 6, 7, 8, and 9 below (FIG. 3), using a capacity $Q_{icA}$ of the active material A in the initial state, a capacity $Q_{icB}$ of the active material B in the initial state, a charge amount $q_A$ of the active material A, and a charge amount $q_B$ of the active material B.

$$E_{cA} = f_{cA}(q_A/Q_{icA}) \quad \text{(Expression 6)}$$

$$E_{cB} = f_{cB}(q_B/Q_{icB}) \quad \text{(Expression 7)}$$

$$f_{cA}(q_A/Q_{cA}) = f_{cB}(q_B/Q_{cB}) \quad \text{(Expression 8)}$$

$$q = q_{qA} + q_B \quad \text{(Expression 9)}$$

Therefore, a potential $E_c$ of the complex cathode is obtained from Expression 10 below, using a capacity $q_A$ of the cathode of the active material A at a start of charging and a charge amount $Q_{cA}$ of the cathode of the active material A or using a capacity $q_B$ of the cathode of the active material B at a start of charging and a charge amount $Q_{cB}$ of the cathode of the active material B.

$$E_c = f_c(q/Q_{ic}) = f_{cA}(q_A/Q_{cA}) = f_{cB}(q_B/Q_{cB}) \quad \text{(Expression 10)}$$

Note that the potential $E_{cA}$ of the cathode of the active material A and the potential $E_{cB}$ of the cathode of the active material B are each a potential of a surface of each active material. Therefore, since the diffusion resistance of a lithium ion within the active material changes a distribution of a lithium ion within the active material, a relationship between the charge amount and the electromotive voltage seems to be changed due to a charging current. In this embodiment, however, since an active material used for the cathode and a carbon-based active material used for the anode each have a small diffusion resistance therewithin, the active materials are handled as materials for which the relationship between the charging current and the electromotive voltage is not largely changed even if the charging current varies.

Figure 5:
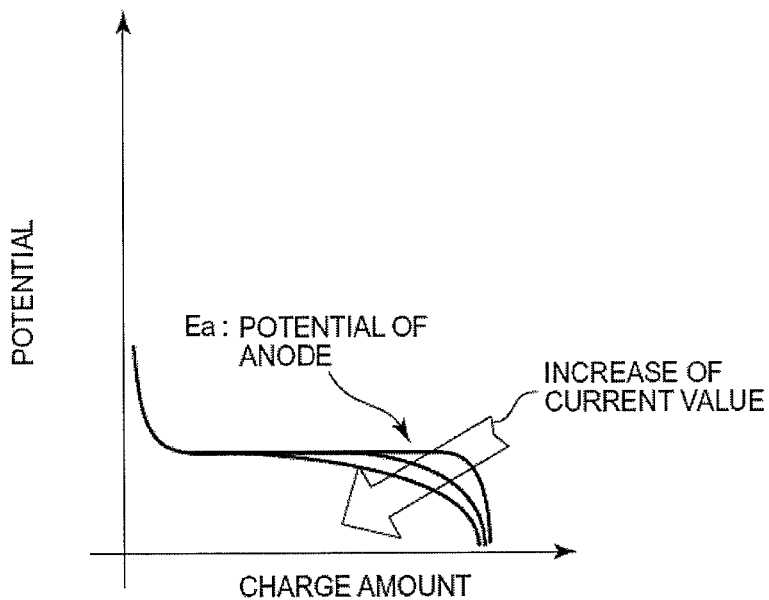
FIG. 5 is a graph showing an example of a change in potential with respect to a charge amount of an anode due to an increase of a current value.

On the other hand, in the case where a material having a large diffusion resistance, such as lithium titanate, is used as an active material of the anode, as shown in FIG. 5, the relationship between the charge amount and the electromotive voltage is largely changed due to the current value, and therefore the approximation similar to that for the cathode is not performed.

Accordingly, the potential $E_a$ of the anode is represented by Expression 11.

$$E_a = f_a(q/Q_{ia}, I/Q_{ia}) \quad \text{(Expression 11)}$$

Further, the voltage $V_R$ based on the internal resistance is obtained from Expressions 12 and 13, using a charging current I and the internal resistance R(q).

$$V_R = R(q) \times I \quad \text{(Expression 12)}$$

$$q = \int I dt \quad \text{(Expression 13)}$$

Specifically, Expression 2 is represented as the following expression.

$$V_c = f_c(q/Q_{ic}) - f_a(q/Q_{ia}, I/Q_{ia}) + R(q) \times I \quad \text{(Expression 2A)}$$

As described above, a non-linear correlation is found among the charging voltage, the electromotive voltage characteristics of the active material, and the internal resistance. Based on the above, with the internal resistance and the capacity of the active material being set as variables, a regression calculation is performed on a characteristic curve of the charging voltage with respect to the charge amount to thereby calculate and determine an internal resistance and a capacity of the active material.

The deterioration degree calculation program 152 is a unit that causes the CPU 100 to implement a capability of calculating a degree of deterioration of the secondary battery apparatus 20 from the values of the internal resistance and the capacity of the active material, the values being obtained by executing the regression calculation program 151.

After the internal resistance and the capacity of each of the active materials are set to be variables and a function for obtaining the degree of deterioration is stored in a function information DB (database) 163, a function is read out from the function information DB 163 to be compared with the internal resistance and the capacity of each of the active materials that are obtained by the regression calculation program 151, to thereby calculate a degree of deterioration of the secondary battery apparatus 20.

For example, after a reference value of the capacity and that of the internal resistance are stored, in the case where a value of the capacity or internal resistance obtained by the regression calculation program 151 becomes smaller than the reference value, it may be determined that the secondary battery apparatus 20 is too deteriorated to be used. Alternatively, depending on use applications, after a computation method (function) for a deterioration index to be computed based on the capacity value and the internal resistance value is stored, the deterioration index computed using the internal resistance value and the capacity value obtained by the regression calculation program 151 may be presented as a degree of deterioration.

The storage unit 160 is a nonvolatile storage device or storage unit such as a hard disk drive (HDD). The storage unit 160 is not limited to the nonvolatile storage unit. A semiconductor memory such as a flash memory may be used therefor or a storage medium in a form in which those semiconductor memories and the HDD are combined may be used therefor. In this embodiment, the ROM 150 and the storage unit 160 are described as different storage media. However, the ROM and the storage unit may be combined to each other as one storage unit.

The storage unit 160 stores a determination result DB 161, a calculation result DB 162, and the function information DB 163. In addition, the storage unit 160 also stores data necessary for calculation processing performed by the CPU 100 therein.

Figure 6:
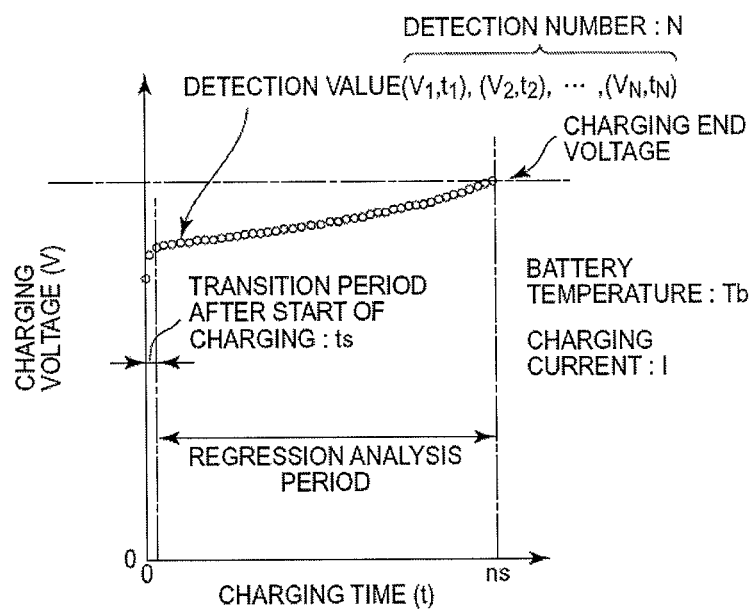
FIG. 6 is a graph showing an example of a detection value of a charging voltage with respect to a charging time.

The determination result DB 161 stores determination data including the determined current value, voltage value, and the like of the secondary battery apparatus 20 at predetermined determination intervals. For example, the data is stored in a form of a table. The data is drawn as shown in FIG. 6. The stored data on the determination result is used when the regression calculation program 151 is executed.

The calculation result DB 162 stores a value calculated by the CPU 100 executing the regression calculation program 151. The stored value may be read out by the CPU 100 and displayed on the display unit 141 via the display IF 140. Instead of this storage unit, the data described above may be stored on a storage medium provided externally to the calculation apparatus 10 in a cloud computing system.

Further, the function information DB 163 stores a function representing a relationship between the cathode potential and the charge amount as shown in FIG. 4, a function representing a relationship between the anode potential and the charge amount as shown in FIG. 5, and values thereof. Those functions and values mean that the relationship between the anode potential and the charge amount shown in FIG. 5 reduces, due to an increase of the current value, a region where the anode potential with respect to the charge amount becomes constant. This function information is used when the degree of deterioration of the cathode and that of the anode are evaluated.

Further, data used when a potential of the cathode with respect to the charge amount and that of the anode with respect to the charge amount are obtained are also stored. In the case where the cathode or the anode is formed of a plurality of materials, a function corresponding to each of the materials is stored.

The timer 170 is a clock for counting a time. Using the counted time of day, the CPU 100 detects and stores the current value and the voltage value. The calculation apparatus 10 may have a form to acquire a time via a network instead of the timer 170, or may have a form to calculate a time of day based on the count of the timer 170 and the time of day that is acquired from the network.

The secondary battery apparatus 20 is an apparatus including a battery and a control circuit that detects a current value, a voltage value, and the like of the battery. For the battery, various secondary batteries may be used. For example, a VTM (voltage transformation module) 21 detects a voltage, and a current detection circuit 602 detects a current.

The terminal 30 is a vehicle that loads the above-mentioned secondary battery apparatus 20 or a stationary battery apparatus. The terminal 30 includes a CPU 300, a RAM (RWM) 310, a communication IF 320, an input IF 331, a display IF 341, a ROM 350, a storage unit 360, a timer 370, and a rechargeable battery 380. Note that the terminal 30 may include a charger 381 that charges the rechargeable battery, and an inverter 382 that performs DC-AC conversion at a time when power is transmitted to a motor 383 from the rechargeable battery. Alternatively, instead of the CPU 300 that controls the terminal 30, a programmable controller 385 may be used.

The capabilities of the respective constituent elements of the terminal 30 are the same as those of the constituent elements of the calculation apparatus 10, and therefore a description thereof will be omitted. Note that the CPU 100 and the CPU 300 may divide the programs for execution. The rechargeable battery 380 is a secondary battery apparatus 20.

Figure 7:
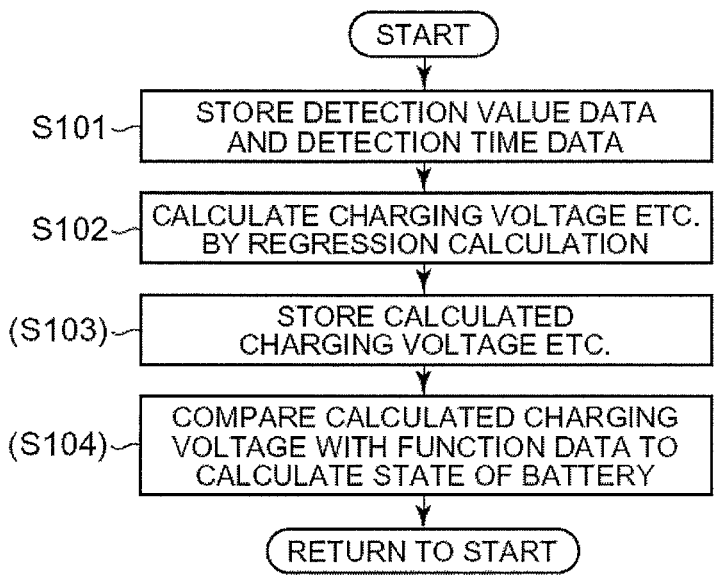
FIG. 7 is a flowchart showing an operation of a calculation apparatus according to the first embodiment.
Figure 8:
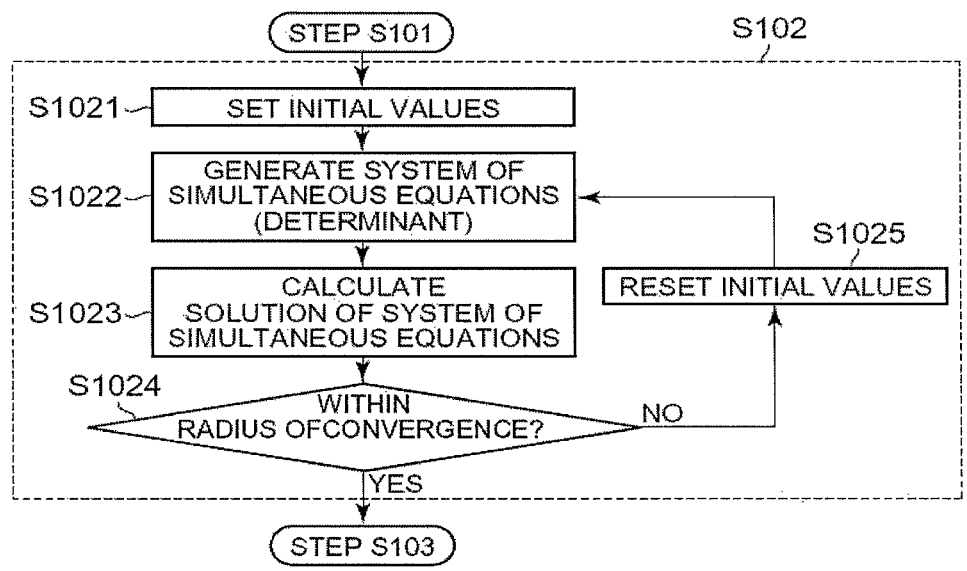
FIG. 8 is a flowchart showing an example of a regression calculation according to the first embodiment.

Next, an example of a specific operation will be described mainly with reference to FIGS. 7 and 8.

A charging current value in the case of constant current charging is described for simplicity. The charging current value is not necessarily constant, but it is suitable to be detected in the constant current charging, because of less occurrence of detection errors and calculation errors.

Further, the internal resistance value is handled as a value that does not vary with respect to the charge amount q.

Further, in this embodiment, a description will be given of a case where a voltage is detected for each battery cell. In the case where the calculation method of this embodiment is used for a battery module including a plurality of cells, like an assembled battery, since a progress status of deterioration differs between the cells, it is suitable to detect a time variation of the charging voltage for each of the cells (Step S101).

The charging voltage thus detected is stored in the determination result DB 161. During a charging time $t_c$ from a start of charging to a time when a charging end voltage is obtained, N detection values are obtained. Since the charging voltage is not stable immediately after the start of charging, that is, during a transition period, ns pieces of data obtained during this transition period is are not used in the regression calculation for calculating an internal resistance and a capacity of an active material.

The calculation apparatus 10 acquires a detection value of a charging voltage in each cell. The acquired value is temporarily stored in the RAM 110 or stored in the storage unit 160.

The CPU 100 executes the regression calculation program 151 read from the ROM 150 and analyzes a solution of a non-linear differential equation by the regression calculation (Step S102).

Since the constant current charging is performed, a charge amount $q_c$ from the start of charging is obtained from Expression 13 below.

$$q_c = I * t$$

In such a manner, detection voltages corresponding to the charge amount q, that is, detection values $(V_1, q_{c1})$, $(V_2, q_{c2}), \ldots, (V_N, q_{cN})$ are obtained.

The CPU 100 causes the RAM 110 to temporarily store the obtained values therein or the storage unit 160 to store them therein.

Using the above-mentioned detection values, the regression calculation is performed. A residual sum of squares to be used when the regression calculation is performed is represented by the following expression.

(Expression 14)
$$S = \sum_{n=ns+1}^{N} (V_n - (f_c((q_{cn} + q_0^c)/Q_c) - f_a((q_{cn} + q_0^a)/Qa, I/Qa)))^2$$

$q_0^c$: Amount of charge in cathode at start of charging $q_0^a$: Amount of charge in anode at start of charging The charge amount at the start of charging is an unknown when the regression calculation is performed, which means that the charge amount of the cathode and that of the anode at the start of charging are also unknowns.

In this embodiment, in the case where the cathode is a complex cathode formed of the active material A and the active material B, unknowns of the regression calculation are the following values.

$$Q_{cA}, Q_{cB}, Q_a, q_0^{cA}, q_0^{cB}, q_0^a, R \qquad \text{(Numerical Value 15)}$$

Accordingly, a solution of the following system of simultaneous equations is obtained (Step S1022).

(Expression 16)
$$\begin{cases} \frac{\partial S}{\partial Q_{cA}} = 0 \\ \frac{\partial S}{\partial Q_{cB}} = 0 \\ \frac{\partial S}{\partial Q_a} = 0 \\ \frac{\partial S}{\partial q_0^{cA}} = 0 \\ \frac{\partial S}{\partial q_0^{cB}} = 0 \\ \frac{\partial S}{\partial q_0^a} = 0 \\ \frac{\partial S}{\partial R} = 0 \end{cases}$$

As initial values, appropriate values, e.g., values of the last determination are used (Step S1021).

(Expression 17)
$$\begin{cases} \frac{\partial S}{\partial Q_{cA}} = 0 \\ \frac{\partial S}{\partial Q_{cB}} = 0 \\ \frac{\partial S}{\partial Q_a} = 0 \\ \frac{\partial S}{\partial q_0^{cA}} = 0 \\ \frac{\partial S}{\partial q_0^{cB}} = 0 \\ \frac{\partial S}{\partial q_0^a} = 0 \\ \frac{\partial S}{\partial R} = 0 \end{cases}$$

Values for the subsequent step are obtained by the following expression (Step S1023).

(Expression 18)
$$\begin{cases} Q_{cA} \leftarrow Q_{cA} + \delta Q_{cA} \\ Q_{cB} \leftarrow Q_{cB} + \delta Q_{cB} \\ Q_a \leftarrow Q_a + \delta Q_a \\ q_0^{cA} \leftarrow q_0^{cA} + \delta q_0^{cA} \\ q_0^{cB} \leftarrow q_0^{cB} + \delta q_0^{cB} \\ q_0^a \leftarrow q_0^a + \delta q_0^a \\ R \leftarrow R + \delta R \end{cases}$$

In this case, the following values are obtained by solving the next expression.

$$\delta Q_{cA}, \delta Q_{cB}, \gamma Q_a, \delta q_0^{cA}, \delta q_0^{cB}, \delta R \qquad \text{(Numerical Value 19)}$$

In this embodiment, the description is given using Newton's method. Instead thereof, however, another numerical analytical approach such as a Levenberg-Marquardt algorithm may be used.

(Expression 20)

$$\begin{pmatrix} \frac{\partial^2 S}{\partial Q_{cA}^2} & \frac{\partial^2 S}{\partial Q_{cA} \partial Q_{cB}} & \frac{\partial^2 S}{\partial Q_{cA} \partial Q_a} & \frac{\partial^2 S}{\partial Q_{cA} \partial q_0^{cA}} & \frac{\partial^2 S}{\partial Q_{cA} \partial q_0^{cB}} & \frac{\partial^2 S}{\partial Q_{cA} \partial q_0^a} & \frac{\partial^2 S}{\partial Q_{cA} \partial R} \\ \frac{\partial^2 S}{\partial Q_{cA} \partial Q_{cB}} & \frac{\partial^2 S}{\partial Q_{cB}^2} & \frac{\partial^2 S}{\partial Q_{cB} \partial Q_a} & \frac{\partial^2 S}{\partial Q_{cB} \partial q_0^{cA}} & \frac{\partial^2 S}{\partial Q_{cB} \partial q_0^{cB}} & \frac{\partial^2 S}{\partial Q_{cB} \partial q_0^a} & \frac{\partial^2 S}{\partial Q_{cB} \partial R} \\ \frac{\partial^2 S}{\partial Q_{cA} \partial Q_a} & \frac{\partial^2 S}{\partial Q_{cB} \partial Q_a} & \frac{\partial^2 S}{\partial Q_a^2} & \frac{\partial^2 S}{\partial Q_a \partial q_0^{cA}} & \frac{\partial^2 S}{\partial Q_a \partial q_0^{cB}} & \frac{\partial^2 S}{\partial Q_a \partial q_0^a} & \frac{\partial^2 S}{\partial Q_a \partial R} \\ \frac{\partial^2 S}{\partial Q_{cA} \partial q_0^{cA}} & \frac{\partial^2 S}{\partial Q_{cB} \partial q_0^{cA}} & \frac{\partial^2 S}{\partial Q_a \partial q_0^{cA}} & \frac{\partial^2 S}{\partial q_0^{cA2}} & \frac{\partial^2 S}{\partial q_0^{cA} \partial q_0^{cB}} & \frac{\partial^2 S}{\partial q_0^{cA} \partial q_0^a} & \frac{\partial^2 S}{\partial q_0^{cA} \partial R} \\ \frac{\partial^2 S}{\partial Q_{cA} \partial q_0^{cB}} & \frac{\partial^2 S}{\partial Q_{cB} \partial q_0^{cB}} & \frac{\partial^2 S}{\partial Q_a \partial q_0^{cB}} & \frac{\partial^2 S}{\partial q_0^{cA} \partial q_0^{cB}} & \frac{\partial^2 S}{\partial q_0^{cB2}} & \frac{\partial^2 S}{\partial q_0^{cB} \partial q_0^a} & \frac{\partial^2 S}{\partial q_0^{cB} \partial R} \\ \frac{\partial^2 S}{\partial Q_{cA} \partial q_0^a} & \frac{\partial^2 S}{\partial Q_{cB} \partial q_0^a} & \frac{\partial^2 S}{\partial Q_a \partial q_0^a} & \frac{\partial^2 S}{\partial q_0^{cA} \partial q_0^a} & \frac{\partial^2 S}{\partial q_0^{cB} \partial q_0^a} & \frac{\partial^2 S}{\partial q_0^{a2}} & \frac{\partial^2 S}{\partial q_0^a \partial R} \\ \frac{\partial^2 S}{\partial Q_{cA} \partial R} & \frac{\partial^2 S}{\partial Q_{cB} \partial q_0^a} & \frac{\partial^2 S}{\partial Q_a \partial R} & \frac{\partial^2 S}{\partial q_0^{cA} \partial R} & \frac{\partial^2 S}{\partial q_0^{cB} \partial R} & \frac{\partial^2 S}{\partial q_0^a \partial R} & \frac{\partial^2 S}{\partial R^2} \end{pmatrix} \begin{pmatrix} \delta Q_{cA} \\ \delta Q_{cB} \\ \delta Q_a \\ \delta q_0^{cA} \\ \delta q_0^{cB} \\ \delta q_0^a \\ \delta R \end{pmatrix} =$$

$$\begin{pmatrix} -\frac{\partial S}{\partial Q_{cA}} \\ -\frac{\partial S}{\partial Q_{cB}} \\ -\frac{\partial S}{\partial Q_{ca}} \\ -\frac{\partial S}{\partial q_0^{cA}} \\ -\frac{\partial S}{\partial q_0^{cB}} \\ -\frac{\partial S}{\partial q_0^a} \\ -\frac{\partial S}{\partial R} \end{pmatrix}$$

The computation is repeated until the obtained values satisfy the following convergence condition (radius of convergence) (Steps S1024 and S1025).

$$\begin{cases} \delta Q_{cA} < \varepsilon_{Q_{cA}} \\ \delta Q_{cB} < \varepsilon_{Q_{cB}} \\ \delta Q_a < \varepsilon_{Q_a} \\ \delta q_0^{cA} < \varepsilon_{q_0^{cA}} \\ \delta q_0^{cB} < \varepsilon_{q_0^{cB}} \\ \delta q_0^a < \varepsilon_{q_0^a} \\ \delta R < \varepsilon_R \end{cases}$$ (Expression 21)

Results of the computations repeated in such a manner are stored in the storage unit 160 (Step S103).

Next, the CPU 100 executes the deterioration degree calculation program 152.

The capacity and the internal resistance that have been calculated by the regression calculation program 151 described above are compared with deterioration references stored in advance, or a computation method (function) stored in advance is performed using those capacity and internal resistance, to thereby calculate a degree of deterioration (Step S104).

The CPU 100 executes a display control method such as a display program to display the calculated results on the display unit 141.

Note that the charging voltage and the internal resistance that have been computed in Step S102 may be displayed on the display unit 141 as they are.

Next, computation processing in Step S1022 will be exemplified.

First of all, in the case where the cathode or the anode is a single electrode, when a calculation is performed for the third column and the third row in Expression 27, for example, the following expression is obtained.

(Expression 22)

$$\frac{\partial^2 S}{\partial Q_a^2} = \frac{\partial^2}{\partial Q_a^2} \sum_{n=ns+1}^{N} (V_n - (f_c((q_{cn} + q_0^c)/Q_c) - f_a((q_{cn} + q_0^a)/Q_a, I/Q_a)) - R \times I)^2$$

$$= \sum_{n=ns+1}^{N} \frac{\partial^2}{\partial Q_a^2} (V_n - (f_c((q_{cn} + q_0^c)/Q_c) - f_a((q_{cn} + q_0^a)/Q_a, I/Q_a)) - R \times I)^2$$

Then, a differentiation is performed using a small displacement ΔQc, and the following expression is obtained.

(Expression 23)

$$\sum_{n=ns+1}^{N} \frac{\partial^2}{\partial Q_a}(V_n - (f_c((q_{cn}+q_0^c)/Q_c) - f_a((q_{cn}+q_0^a)/Q_a, I/Q_a)) - R \times I)^2 =$$

$$\sum_{n=ns+1}^{N} \left\{ \frac{\left(V_n - \left(f_c\left(\frac{(q_{cn}+q_0^c)}{Q_c}\right) - f_a\left(\frac{(q_{cn}+q_0^a)}{(Q_a+\delta Q_a)}, I/(Q_a+\delta Q_a)\right)\right) - R \times I\right)^2}{\delta Q_a^2} - \right.$$

$$2\frac{\left(V_n - \left(f_c\left(\frac{(q_{cn}+q_0^c)}{Q_c}\right) - f_a\left(\frac{(q_{cn}+q_0^a)}{(Q_a)}, I/(Q_a)\right)\right) - R \times I\right)^2}{\delta Q_a^2}$$

$$\left. \frac{\left(V_n - \left(f_c\left(\frac{(q_{cn}+q_0^c)}{Q_c}\right) - f_a\left(\frac{(q_{cn}+q_0^a)}{(Q_a-\delta Q_a)}, I/(Q_a-\delta Q_a)\right)\right) - R \times I\right)^2}{\delta Q_a^2} \right\}$$

In the same manner, when a calculation is performed for the first row and the seventh column in Expression 27, the following expression is obtained.

(Expression 24)

$$\sum_{n=ns+1}^{N} \frac{\partial^2}{\partial Q_a \partial R}(V_n - (f_c((q_{cn}+q_0^c)/Q_c) - f_a((q_{cn}+q_0^a)/Q_a, I/Q_a)) - R \times I)^2 =$$

$$\sum_{n=ns+1}^{N} \left\{ \frac{\left(V_n - \left(f_c\left(\frac{(q_{cn}+q_0^c)}{Q_c}\right) - f_a\left(\frac{(q_{cn}+q_0^a)}{(Q_a+\delta Q_a)}, I/(Q_a+\delta Q_a)\right)\right) - (R+\delta R) \times I\right)^2}{4\delta Q_a \delta R} - \right.$$

$$\left(\frac{\left(V_n - \left(f_c\left(\frac{(q_{cn}+q_0^c)}{Q_c}\right) - f_a\left(\frac{(q_{cn}+q_0^a)}{(Q_a+\delta Q_a)}, I/(Q_a+\delta Q_a)\right)\right) - (R-\delta R) \times I\right)^2}{4\delta Q_a \delta R} - \right.$$

$$\left(\frac{\left(V_n - \left(f_c\left(\frac{(q_{cn}+q_0^c)}{Q_c}\right) - f_a\left(\frac{(q_{cn}+q_0^a)}{(Q_a-\delta Q_a)}, I/(Q_a-\delta Q_a)\right)\right) - (R+\delta R) \times I\right)^2}{4\delta Q_a \delta R} \right.$$

$$\left. \left(\frac{\left(V_n - \left(f_c\left(\frac{(q_{cn}+q_0^c)}{Q_c}\right) - f_a\left(\frac{(q_{cn}+q_0^a)}{(Q_a-\delta Q_a)}, I/(Q_a-\delta Q_a)\right)\right) - (R-\delta R) \times I\right)^2}{4\delta Q_a \delta R}\right) \right\}$$

A calculation is similarly performed for other terms.

Figure 9:
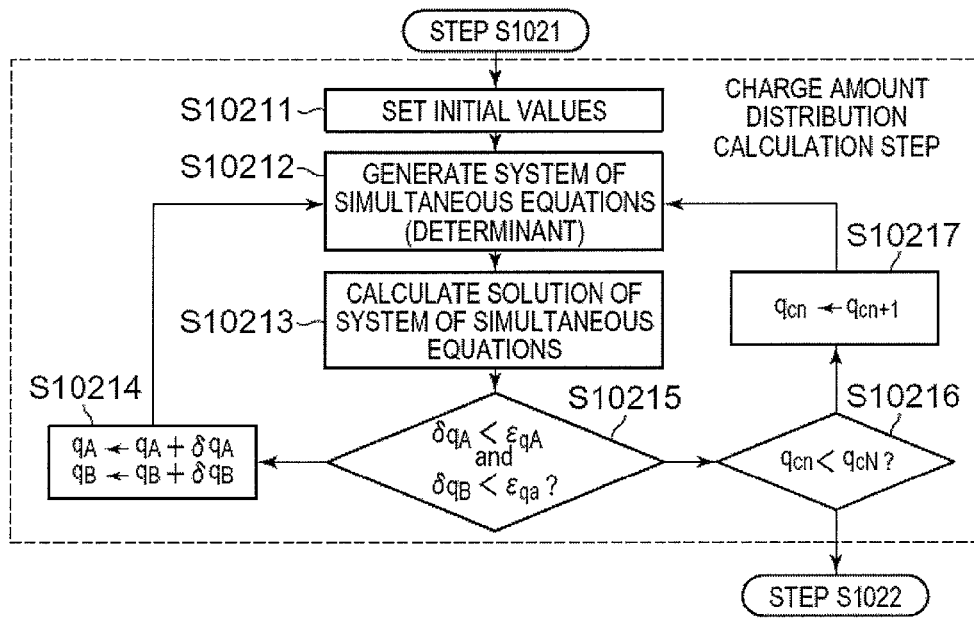
FIG. 9 is a flowchart showing an example of a charge amount distribution calculation according to the first embodiment.

Next, a description will be given of preprocessing for a computation in Step S1022 in the case where the cathode is formed of a complex material, with reference to FIG. 9.

First of all, initial values are set (Step S10211).

$$q_{cn} \leftarrow q_{c\,ns+1}, q_A, q_B$$

Next, a system of simultaneous equations for $q_A$ and $q_B$ is generated, and a solution is obtained (Steps S10212 and S10213).

(Expression 25)

$$\frac{\partial f_{cA}(q_{An}/Q_{cA})}{\partial q}\delta q_A - \frac{\partial f_{cB}(q_{Bn}/Q_{cB})}{\partial q}\delta q_B =$$

$$-f_{cA}(q_{An}/Q_{cA}) + f_{cB}(q_{Bn}/Q_{cB})$$

-continued $$[A_c] = \begin{pmatrix} \frac{\partial f_{cA}((q_{An}+q_0^{cA})/Q_{cA})}{\partial q} & \frac{\partial f_{cB}((q_{Bn}+q_0^{cB})/Q_{cB})}{\partial q} \\ 1 & 1 \end{pmatrix}$$

$$(B_c) = \begin{pmatrix} -f_{cA}((q_{An}+q_0^{cA})/Q_{cA}) + f_{cB}((q_{Bn}+q_0^{cB})/Q_{cB}) \\ q_{cn} - q_{An} - q_{Bn} \end{pmatrix}$$

Then, it is determined whether the solution falls in the predetermined radius of convergence (Step S10214).

$$\delta q_A < \epsilon_{q_A}$$

and $$\delta q_B < \epsilon_{q_B} \quad \text{(Expression 26)}$$

In the case where the solution does not fall therein, new initial values are set to obtain $q_A$ and $q_B$ (Step S10215).

In the case where the solution falls therein (YES of Step S10214), a calculation for the next detection point is performed (Steps S10216 and S10217).

The obtained solution is represented by the following expression.

$$\begin{pmatrix} q_{cns+1} & q_{Ans+1} & q_{Bns+1} \\ q_{cns+2} & q_{Ans+2} & q_{Bns+2} \\ \vdots & \vdots & \vdots \\ q_{cN-1} & q_{AN-1} & q_{BN-1} \\ q_{cN} & q_{AN} & q_{BN} \end{pmatrix}$$

(Expression 27)

Here, a voltage of the cathode is obtained by the following expression.

$$(q_{Ans+1}\ q_{Ans+2} \cdots q_{AN})$$

(Expression 28)

This sequence is represented as described below.

$$(q_{Ans+1}(Q_{cA}, Q_{cB}, q_0^{cA}, q_0^{cB}) q_{Ans+2}(Q_{cA}, Q_{cB}, q_0^{cA}, q_0^{cB}) \cdots q_{AN}(Q_{cA}, Q_{cB}, q_0^{cA}, q_0^{cB}))$$

(Expression 29)

Then, when a calculation for $\partial^2 S/\partial Q_{cA}$ is exemplified, the following expression is obtained.

$$\sum_{n=ns+1}^{N} \frac{\partial^2}{\partial Q_a}(V_n - (f_c((q_{cn} + q_0^c)/Q_c) - f_a((q_{cn} + q_0^a)/Q_a, I/Q_a)) - R \times I)^2 =$$

$$\sum_{n=ns+1}^{N} \left( \frac{\left(V_n - \begin{pmatrix} f_{cA}(q_{cAn}(Q_{cA} + \delta Q_{cA}, Q_{cB}, q_0^{cA}, q_0^{cB})/(Q_{cA} + \delta Q_{cA})) - \\ f_a((q_{cn} + q_0^a)/(Q_a + \delta Q_a), I/(Q_a + \delta Q_a)) \end{pmatrix} - R \times I \right)^2}{\delta Q_a^2} \right.$$

$$-2\frac{\left(V_n - \begin{pmatrix} f_{cA}(q_{cAn}(Q_{cA} + Q_{cB}, q_0^{cA}, q_0^{cB})/(Q_{cA})) - \\ f_a((q_{cn} + q_0^a)/(Q_a), I/(Q_a)) \end{pmatrix} - R \times I\right)^2}{\delta Q_a^2}$$

$$\left. \frac{\left(V_n - \begin{pmatrix} f_{cA}(q_{cAn}(Q_{cA} + \delta Q_{cA}, Q_{cB}, q_0^{cA}, q_0^{cB})/(Q_{cA} - \delta Q_{cA})) - \\ f_a((q_{cn} + q_0^a)/(Q_a - \delta Q_a), I/(Q_a - \delta Q_a)) \end{pmatrix} - R \times I\right)^2}{\delta Q_a^2} \right)$$

(Expression 30)

Other terms relating to the cathode are also obtained in the same manner.

As described above, according to this embodiment, the potential of the cathode, the potential of the anode, and the charging voltage are calculated.

As described above, the potential of the cathode and that of the anode are obtained more accurately, which allows a detection of a case where only one of the cathode and the anode is being deteriorated, which would not be allowed in a deterioration determination with use only of a charging voltage. Consequently, a deterioration determination with more accuracy is performed.

In addition, to keep some of the values constant in accordance with the characteristics of the battery achieves processing at high speed.

(Modification)

A description will be given of modifications of the first embodiment with reference to FIGS. 10 to 14.

Figure 10:
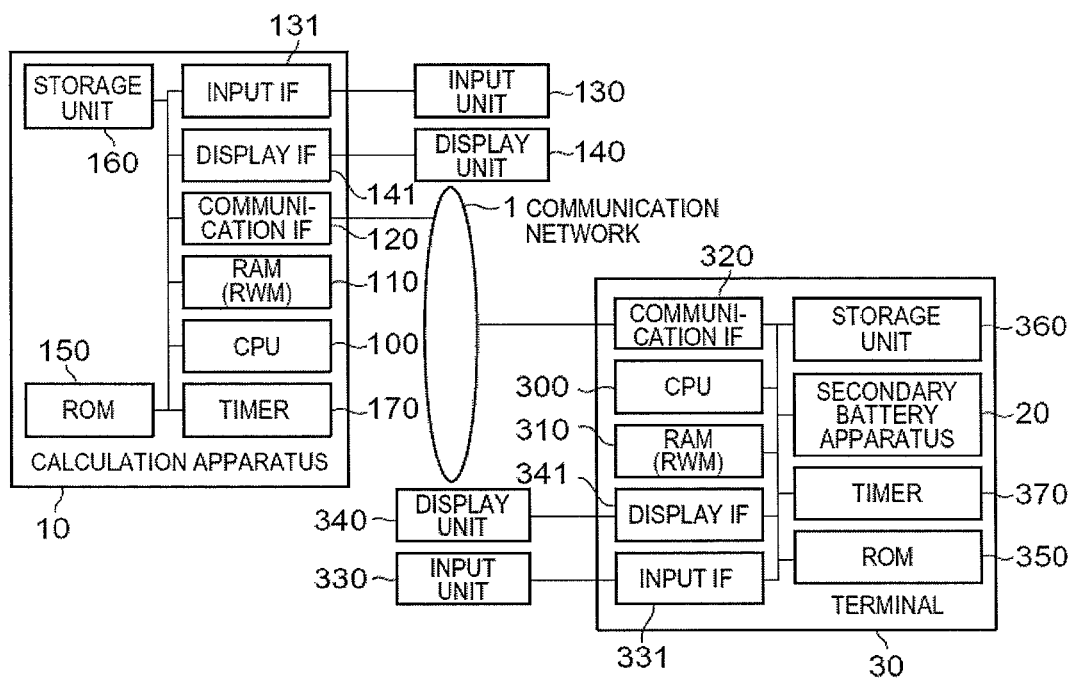
FIG. 10 is a diagram showing a modification of the calculation apparatus according to the first embodiment.
Figure 11:
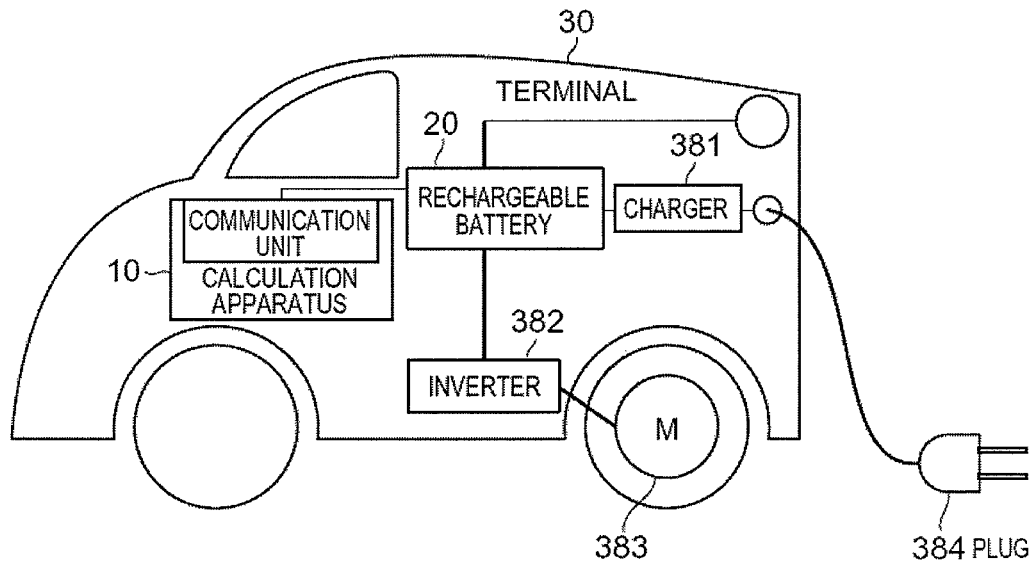
FIG. 11 is a block diagram showing an operation of the calculation apparatus according to the first embodiment.

FIGS. 10 and 11 show that the terminal 30 includes the calculation apparatus 10. In this case, a server is not necessary to be provided on the upper side, and a reduction in amount of information communication through a communication network 1 is executed.

Figure 12:
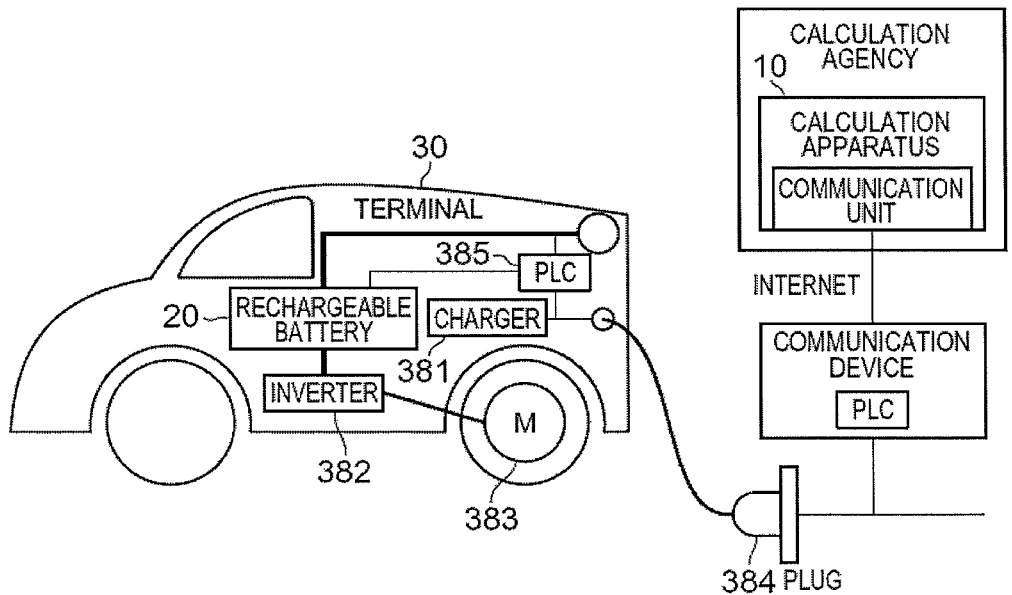
FIG. 12 is a block diagram showing an operation of the calculation apparatus according to the first embodiment.

FIG. 12 shows an embodiment in which a calculation agency collects information of the terminal 30 through the Internet and a communication device to evaluate a state of a battery in the calculation apparatus 10. Data is enabled to be unified for management, which leads to a more precise evaluation for a state of a battery and is additionally useful for maintaining reliability.

Figure 13:
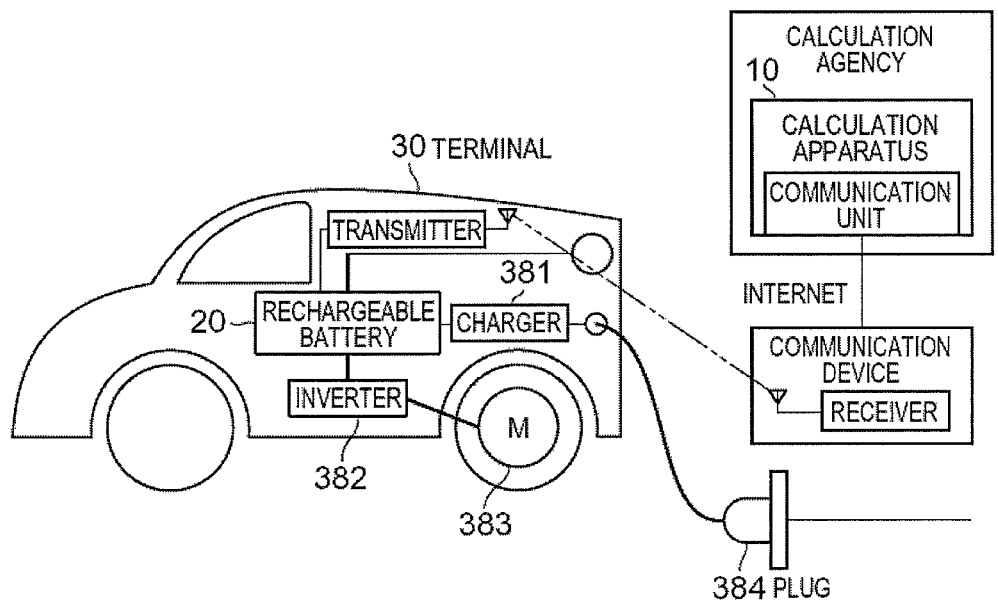
FIG. 13 is a block diagram showing an operation of the calculation apparatus according to the first embodiment.

FIG. 13 shows that battery information is collected from the terminal 30 by wireless communication, which is performed at regular time intervals and is suitable to calculate battery characteristics.

Figure 14:
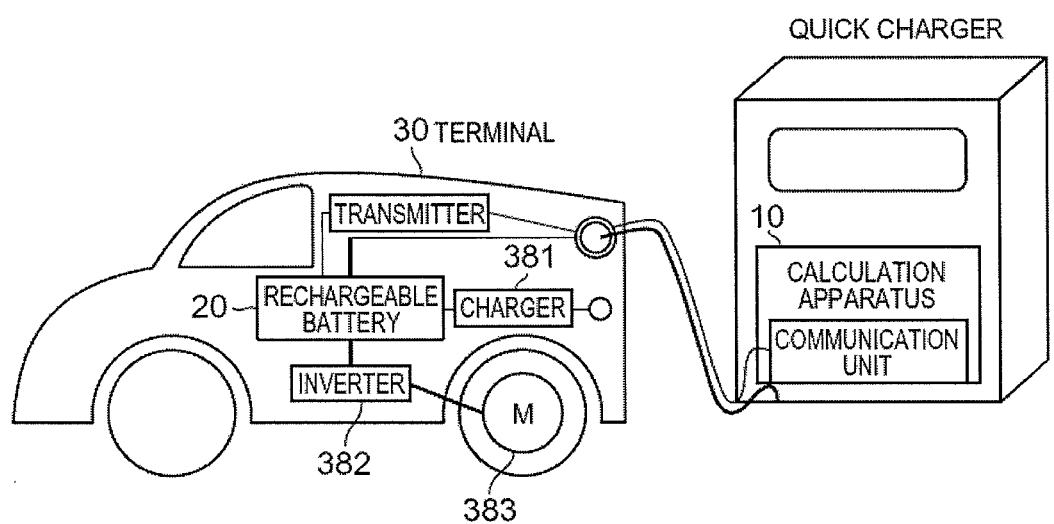
FIG. 14 is a block diagram showing an operation of the calculation apparatus according to the first embodiment.

FIG. 14 shows an embodiment in which the calculation apparatus 10 is provided in a charger such as a quick charger.

While certain embodiments have been described, these embodiments have been presented by way of example only, and are not intended to limit the scope of the inventions. Indeed, the novel methods and systems described herein may be embodied in a variety of the other forms; furthermore, various omissions, substitutions and changes in the form the methods and systems described herein may be made without departing from the sprit of the inventions. The accompanying claims and their equivalents are intended to cover such forms or modifications as would fall within the scope and spirit of the inventions.

What is claimed is:

1. An estimation method for estimating deterioration degree of a battery comprising:
   receiving current information and voltage information at a processor, wherein the current information and voltage information are detected, while charging the battery, by current detector and a voltage detector, respectively installed in a battery apparatus;
   calculating with the processor an amount information of the battery indicating a charge amount based on the current information;
   calculating a first differential value by differentiating a residual sum of squares with respect to a capacity value of an electrode value of the battery, wherein the received current information, the received voltage information, and the calculated amount information are used to obtaining the residual sum of squares;
   calculating a second differential value by differentiating the residual sum of squares with respect to an internal resistance value of the battery;

repeating the calculation of the first differential value and the second differential value until both of the first differential value and the second differential value satisfy a predetermined convergence condition;

calculating a capacity of the electrode using the calculated first differential value and the calculated second differential value; and determining a deterioration degree of the battery by referring to deterioration references stored in a memory based on the calculated capacity and internal resistance.

2. The estimation method according to claim 1, wherein the current information and the voltage information are detected at a predetermined time interval.

3. The estimation method according to claim 1, wherein the current information and the voltage information, received within predetermined time duration from the start of the estimation, are excluded from calculation of the amount information.

4. The estimation method according to claim 1, wherein receiving current information and voltage information at the processor comprises receiving the current information and voltage information from a detection value database configured to store a charge amount of a battery and a voltage of the battery.

5. An apparatus, comprising:

a processor;

a memory device coupled to the processor, the memory device containing a set of instructions that, when executed by the processor, when executed by the processor cause the processor to receive current information and voltage information detected, while charging the battery, by current detector and a voltage detector, respectively installed in a battery apparatus;

calculate amount information of the battery indicating a charge amount based on the current information;

calculate a first differential value by differentiating a residual sum of squares with respect to a capacity value of an electrode value of the battery, wherein the received current information, the received voltage information, and the calculated amount information are used to obtaining the residual sum of squares;

calculate a second differential value by differentiating the residual sum of squares with respect to an internal resistance value of the battery;

repeat the calculation of the first differential value and the second differential value until both of the first differential value and the second differential value satisfy a predetermined convergence condition;

calculate a capacity of the electrode using the calculated first differential value and the calculated second differential value; and determine a deterioration degree of the battery by referring to deterioration references stored in the memory based on the calculated capacity and internal resistance.

6. The apparatus of claim 5, wherein the current information and the voltage information are detected at a predetermined time interval.

7. The apparatus of claim 5, wherein the current information and the voltage information, received within predetermined time duration from the start of the estimation, are excluded from calculation of the amount information.

8. The apparatus of claim 5, wherein the set of instructions that cause the processor to receive current information and voltage information at the processor further cause the processor to receive the current information and voltage information from a detection value database configured to store a charge amount of a battery and a voltage of the battery.

* * * * *